US006194255B1

(12) United States Patent
Hiroki et al.

(10) Patent No.: US 6,194,255 B1
(45) Date of Patent: *Feb. 27, 2001

(54) METHOD FOR MANUFACTURING THIN-FILM TRANSISTORS

(75) Inventors: Masamitsu Hiroki, Kanagawa; Yasuhiko Takemura, Shiga; Mutsuo Yamamoto, Kanagawa; Naoaki Yamaguchi, Kanagawa; Satoshi Teramoto, Kanagawa, all of (JP)

(73) Assignee: Semiconductor Energy Laboratry Co. Ltd (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/839,941

(22) Filed: Apr. 18, 1997

Related U.S. Application Data

(63) Continuation of application No. 08/451,506, filed on May 26, 1995, now abandoned.

(30) Foreign Application Priority Data

Jun. 14, 1994 (JP) .................................................. 6-156513

(51) Int. Cl.[7] .................................................. H01L 21/84
(52) U.S. Cl. ............................................. 438/166; 438/151
(58) Field of Search .................................. 438/151, 149, 438/142, 166, 197, 299, 141, 143, 162, 164

(56) References Cited

U.S. PATENT DOCUMENTS

| 5,112,764 | * | 5/1992 | Mitra et al. . | |
| 5,147,826 | | 9/1992 | Liu et al. | 437/233 |
| 5,275,851 | | 1/1994 | Fonash et al. | 437/233 |
| 5,313,076 | * | 5/1994 | Yamazaki et al. | 257/66 |
| 5,403,772 | * | 4/1995 | Zhang et al. . | |

(List continued on next page.)

FOREIGN PATENT DOCUMENTS

| 62-76772 | * | 4/1987 | (JP) . |
| 2-140915 | * | 5/1990 | (JP) . |
| 3-104210 | * | 5/1991 | (JP) . |

(List continued on next page.)

OTHER PUBLICATIONS

S. M. Sze, VLSI Technology, second edition, pp. 481–482, 1988.*
Ogura et al., "Design and Characteristics of the Lightly Doped Drain–Source (LDD) Insulated Gate Field–Effect Transistor", Aug. 1980, IEEE Transactions on Electron Devices, vol. ED–27, No. 8, pp. 1359–1367.*
Ruska, "Microelectronic Processing: An Introduction to the Manufacture of Integrated Circuits", 1987, McGraw–Hill, Inc., pp. 311–317.*

(List continued on next page.)

Primary Examiner—Charles Bowers
Assistant Examiner—Evan Pert
(74) Attorney, Agent, or Firm—Nixon & Peabody LLP; Jeffrey L. Costellia (57) ABSTRACT

A method of manufacturing a semiconductor device includes process of introducing a material for promoting crystallization of an amorphous semiconductor film, crystallizing the amorphous semiconductor film to form a crystalline semiconductor film, introducing phosphorus to form a source region, a drain region, a pair of light doped regions and a channel region being defined between the pair of the light doped region, heating the crystalline semiconductor film so that the material is diffused from the channel region to each of the source and drain regions through each of the pair of light doped region.

12 Claims, 5 Drawing Sheets

U.S. PATENT DOCUMENTS

| | | | |
|---|---|---|---|
| 5,426,064 | * | 6/1995 | Zhang et al. . |
| 5,457,058 | * | 10/1995 | Yonehara ............... 437/173 |
| 5,946,560 | | 8/1999 | Uochi et al. . |
| 6,028,326 | | 2/2000 | Uochi et al. . |

FOREIGN PATENT DOCUMENTS

| | | | |
|---|---|---|---|
| 4-139728 | * | 5/1992 | (JP) . |
| 6-267978 | * | 9/1994 | (JP) . |
| 6-267980 | * | 9/1994 | (JP) . |

OTHER PUBLICATIONS

M. Bonnel et al., IEEE Electron Dev. Lett., 14(12)(1993)551, "Polysi TFTs with Two–Step Annealing Process", Dec. 1993.*

S. Caune et al., Appl. Surf. Sci., 36(1989)597, "Combined CW Laser and Furnace Annealing of Amorphous Si and Ge in Contact with Some Metals", 1989.*

M. Fuse et al., Solid State Phenomena, 37–38 (1994) 565, ". . . Polysi TFTs by Excimer Laser Annealing. . .with or without Solid Phase Crystallization", 1994.*

F. Fortuna, et al., Appl. Surf. Sci., 73 (1993) 264, ". . .Ion Beam Induced Si Crystallization from a Silicide Interface", 1993.*

G. Radnoczi, et al., Thin Solid Films, 240 (1994) 39, "Defects in Amorphous and SPE Si", 1994.*

O. Schoenfeld, et al., Thin Solid Films, 261 (1995) 236, "Crystallization of a–Si by NiSi2 Precipitates", 1995.*

K.–S. Nam et al., Jpn. J. Appl. Phys., 32 (1–5A)(1993) 1908, "TFTS with Polysi. . . by New Annealing Method", May 1993.*

T. Shinohara et al., Electron. & Comm. in Japan, Part 2, 76(10)(1993)99 ". . . TFTs using self aligned grain boundary control. . ." (abstract), Oct. 1993.*

C. Hayzelden et al., "*In Situ* Transmission Electron Microscopy Studies of Silicide–Mediated Crystallization of Amorphous Silicon" Apl. Phys. Lett. 60 (2) (1992) 225.

A.V. Dvurechenskii et al., "Transport Phenomena in Amorphous Silicon Doped by Ion Implantation of 3d Metals", Phys.Stat.Sol. A95(86)635.

T. Hempel et al., "Needle–Like Crystallization of Ni Doped Amorphous Silicon Thin Films", *Solid State Communications*, vol. 85, No. 11, pp. 921–924, 1993.

"Crystallized Si Films By Low–Temperature Rapid Thermal Annealing Af Amorphous Silicon", R. Kakkad, J. Smith, W.S. Lau, S.J. Fonash, J. Appl. Phys. 65 (5), Mar. 1, 1989, 1989 American Institute of Physics, p. 2069–2072.

"Polycrystalline Silicon Thin Film Transistors on Corning 7059 Glass Substrates Using Short Time, Low Temperature Processing", G. Liu, S.J. Fonash, Appl. Phys. Lett. 62 (20), May 17, 1993, 1993 American Institute of Physics, p. 2554–2556.

"Selective Area Crystallization of Amorphous Silicon Films by Low–Temperature Rapid Thermal Annealing", Gang Liu and S.J. Fonash, Appl. Phys. Lett. 55 (7), Aug. 14, 1989, 1989 American Institute of Physics, p. 660–662.

"Low Temperature Selective Crystallization of Amorphous Silicon", R. Kakkad, G. Liu, S.J. Fonash, Journal of Non–Crystalline Solids, vol. 115, (1989), pp. 66–68.

* cited by examiner

IMPURITY IONS

FIG. 2B
PRIOR ART

LASER

IMPURITY IONS AND LASER

IMPURITY IONS AND LASER

METHOD FOR MANUFACTURING THIN-FILM TRANSISTORS

This application is a Continuation of Ser. No. 08/451,506, filed May 26, 1995, now abandoned.

BACKGROUND OF THE INVENTION

Field of the Invention

The present invention relates to a thin film transistor (in general, called "TFT") and a method of manufacturing the same, and particularly to a method of forming source and drain regions in a thin film transistor.

Figure 2A:
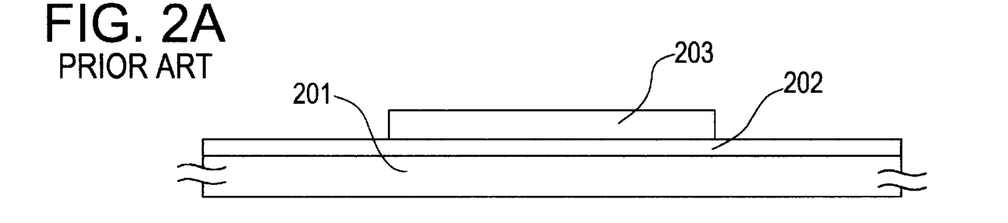
FIGS. 2A to 2D show a process of manufacturing a thin film transistor in accordance with a prior art.

In recent years, there have been known active matrix liquid-crystal display unit using a thin film transistor. FIGS. 2A to 2D show a process of manufacturing a general thin film transistor. First, a silicon oxide film or silicon nitride is formed on a glass substrate 201 as a first coating film 202. A Corning 7059 glass or the like is used as a glass substrate. After the formation of the first coating film 202, a silicon semiconductor film which forms an active layer is formed on the first coating film 202. An amorphous silicon film is usually formed through the plasma CVD technique or low pressure thermal CVD technique, and thereafter the amorphous silicon film is crystallized by heating or the application of laser beam. Then, a silicon film subjected to a crystal property (hereinafter referred to as "crystalline silicon film") is patterned to thereby form an active layer 203. (FIG. 2A)

Figure 2B:
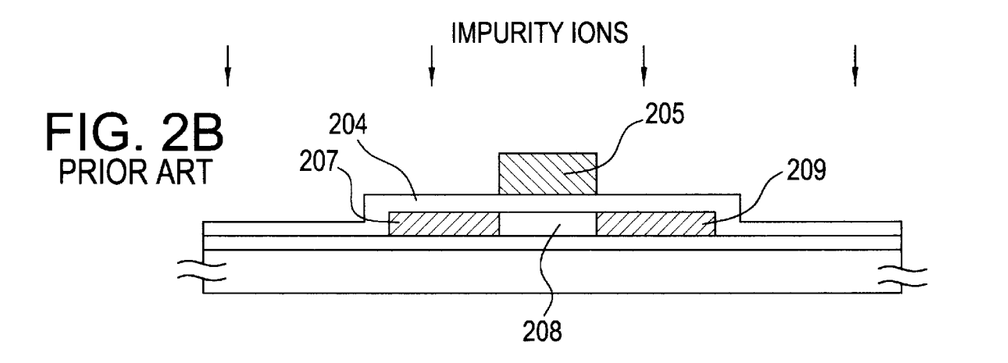

After the formation of the active layer 203, a silicon oxide film is formed as a gate insulating film 204 through the plasma CVD technique or the sputtering technique. Then, a gate electrode 205 is formed of material mainly containing metal or semiconductor. After the formation of the gate electrode 205, impurity ions are injected thereinto so as to form a source region 207 as well as a drain region 209. This process is executed using the gate electrode 205 as a mask. As the ions injected, P (phosphorus) is used in the manufacture of an n-channel thin film transistor, whereas B (boron) is used in the manufacture of a p-channel thin film transistor. Also, a channel formation region 208 is formed simultaneously during this process. (FIG. 2B)

Figure 2C:
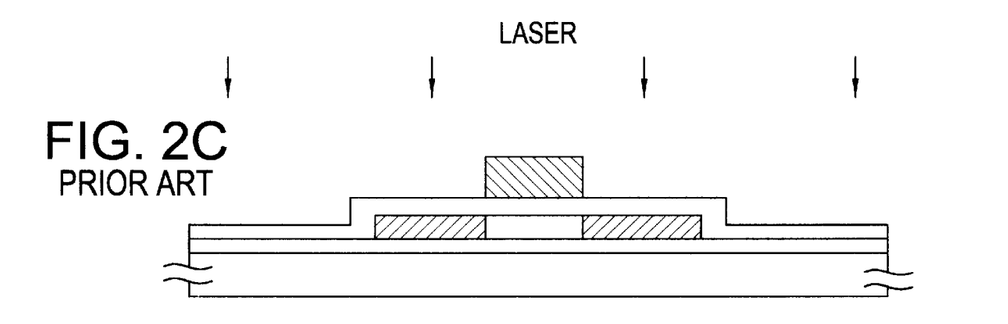

After the formation of the source region 207 and the drain region 209 as well as the channel formation region 208, the source region 207 and the drain region 209 are recrystallized by application of a laser beam or an infrared ray, and the impurity ions injected into those region are activated. The recrystallization of the source region 207 and the drain region 209 are made because the source region 207 and the drain region 209 have been made amorphous by the bombardment of injected ions at the time of the preceding ion injection.

The above-mentioned recrystallization and activation of the source and drain regions may be performed by heating. However, in the case of heating, its effect could not be obtained without heating at temperature of 700° C. or higher (preferably 800° C. or higher). Taking the heat-resistivity of a glass substrate (a substrate made of Corning 7059 glass must be dealt with at 600° C. or lower) into account, such a heat treatment is improper.

Figure 2D:
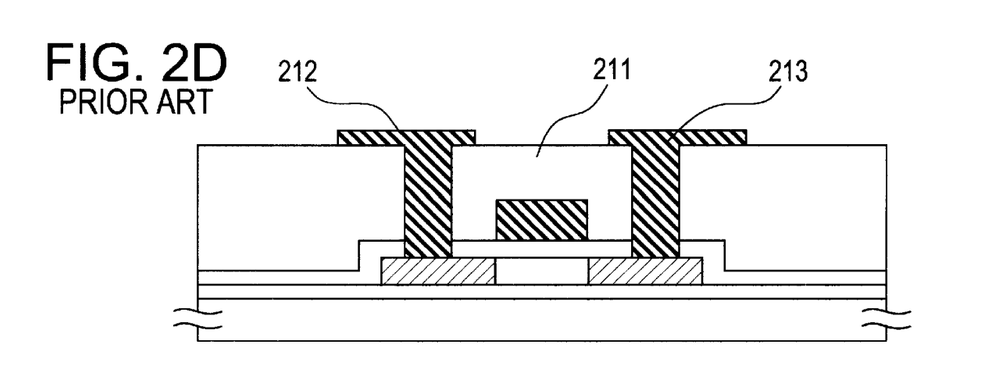

Subsequently, an interlayer insulating film 211 is formed of silicon oxide or other insulating materials. Further, after forming contact holes, a source electrode 212 and a drain electrode 213 are formed of a proper metallic material.

The thin film transistor manufactured through the foregoing processes suffers from such a problem that its characteristics are deteriorated or largely dispersed. This problem results from the fact that defects concentrate in the vicinity of interfaces between the source region 207 and the channel formation region 208 and between the drain region 209 and the channel formation region 208.

In other words, the source region 207 and the drain region 209, which have been made amorphous by the injection of ions in the process of FIG. 2B, are recrystallized by the application of a laser beam in the process of FIG. 2C, during which the channel formation region 208 remains crystalline. Therefore, the crystallization of the source and drain regions, which progresses by the application of a laser beam, stops at the interfaces between the source and drain regions and the channel formation region having the crystal property from the first. As a result, a large number of defects resulting from mismatching of lattices are produced in the vicinity of the interfaces between the source and drain regions and the channel formation region. The existence of those defects makes not only the characteristics dispersed and unstable but also an off-state current increase.

As a manner of solving the foregoing problem, it has been found that the recrystallization of the source and drain regions and the activation of the impurity ions are performed at a temperature of 700° C. or higher, preferably 800° C. or higher. If the recrystallization of the source and drain regions and the activation of the impurity ions are performed at a temperature of 700° C. or higher, preferably 800° C. or higher, energy is also applied to the channel formation region 208. Hence, mismatching of lattices produced in the vicinity of the interfaces between the source and drain regions and the channel formation region can be released, as a result of which the defects can be prevented from concentrating in the vicinity of the interfaces between the source and drain regions and the channel formation region.

However, in order that processes for the recrystallization of the source and drain regions and the activation of impurity ions injected are performed by a process of heating at 700° C. or higher, a substrate capable of resisting a temperature of 700° C. or higher must be used. However, such a substrate is expensive, resulting in a large obstacle to the use of the thin film transistor in a liquid-crystal display apparatus. In other words, in the use of an inexpensive glass substrate having a heat-resistant temperature of 600° C. or lower, the processes for the recrystallization of the source and drain regions and the activation of impurity ions cannot be realized by heating for all practical purposes.

SUMMARY OF THE INVENTION

The present invention has been made in view of the above problems with the prior art, and an object of the invention is to execute the recrystallization and activation of source and drain regions at a temperature lower than that in the prior art.

Another object of the invention is to provide a thin film transistor with a structure in which defects on interfaces between source and drain regions and a channel formation region are reduced.

A still another object of the invention is to provide a thin film transistor which is sufficiently high in a crystal property of the source and drain regions.

In order to achieve the above objects, according to one aspect of the invention, there is provided a method of manufacturing a thin film transistor, comprising the steps of:

introducing a metal element for promoting crystallization into an amorphous silicon film;

subjecting said amorphous silicon film to a heat treatment to form a crystalline silicon film;

forming an active layer using said crystalline silicon film;

selectively injecting impurity ions into a part of said active layer; and subjecting said active layer to a heat treatment to grow crystal from a region into which said impurity ions have not been injected toward a region into which said impurity ions have been injected.

In the foregoing structure, Fe, Co, Ni, Ru, Rh, Pd, Os, Ir, Pt, Cu, Ag and Au are applicable as the metal element which promotes crystallization. In particular, the use of Ni (nickel) makes it possible to obtain a remarkable effect.

An amorphous silicon film is formed on a glass substrate, a quartz substrate, or a semiconductor substrate or metal substrate having an insulating surface. The amorphous silicon film is formed through a vapor phase technique such as a plasma CVD technique or low pressure thermal CVD technique, or the sputtering technique.

As the impurity ions, ions of phosphorus or boron are used.

In the foregoing structure, it is effective to apply a laser beam or an intense light beam to the formed film before or after the heat treatment. In particular, the application of a laser beam after the heat treatment makes the crystal property of the film effectively enhanced.

According to another aspect of the invention, there is provided a method of manufacturing a thin film transistor, comprising the steps of:

introducing a metal element for promoting crystallization into an amorphous silicon film;

subjecting said amorphous silicon film to a heat treatment to form a crystalline silicon film;

forming an active layer using said crystalline silicon film;

selectively injecting impurity ions into regions of said active layer; and subjecting said active layer to a heat treatment to recrystallize the impurity doped regions with the region which is not introduced with the ions used as crystal nuclei.

According to still another aspect of the invention, the active layer has such a structure that a crystal grows from said channel formation region toward the source and drain regions adjacent to said channel formation region with the channel formation region functioning as a crystalline nucleus.

Figure 3A:
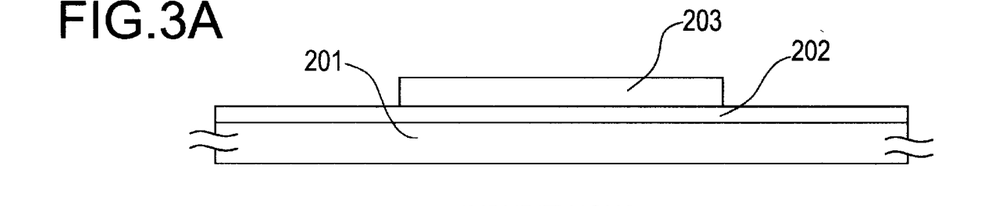
FIGS. 3A to 3D show a process of manufacturing a thin film transistor in accordance with another embodiment of the present invention.
Figure 3B:
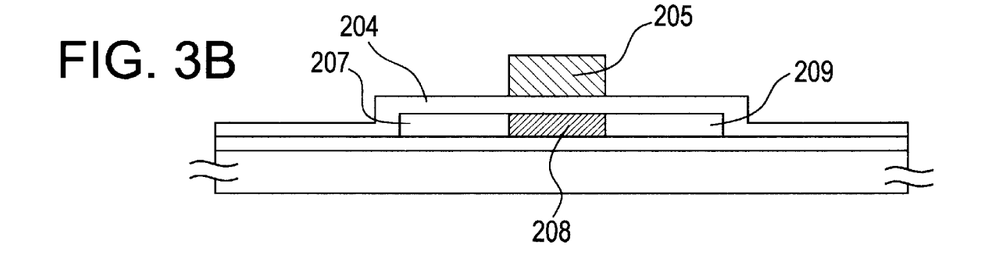
Figure 3C:
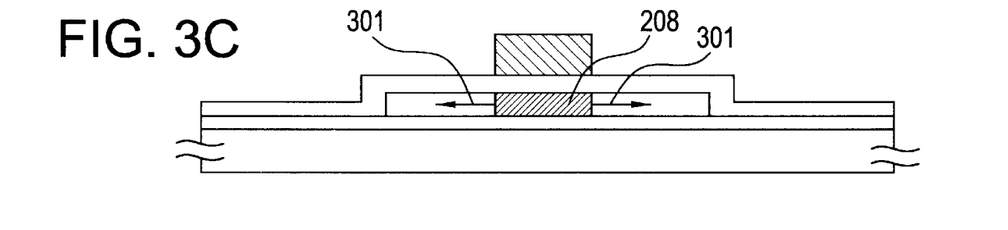
Figure 3D:
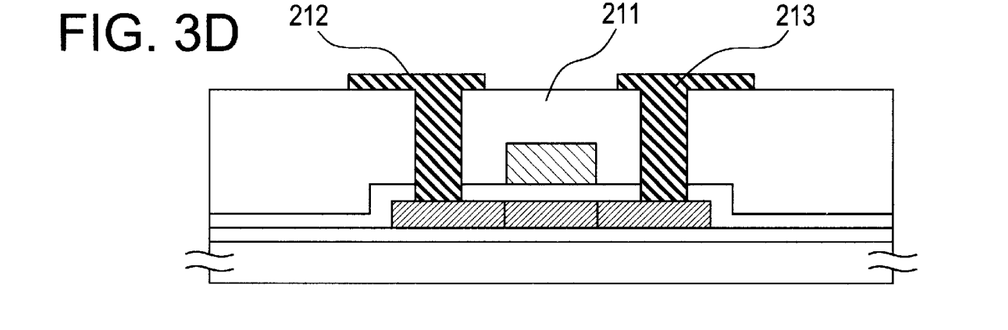

For example, in a thin film transistor as shown in FIG. 3D, a crystal growth develops as indicated by arrows 301 with a channel formation region 208 being a crystalline nucleus as shown in FIG. 3C, as a result of which a source region 207 and a drain region 209 are crystallized.

According to yet still another aspect of the invention, the active layer has such a structure that a crystal grows from a peripheral region of the channel formation region toward the source and drain regions adjacent to said peripheral region with said peripheral region being a crystalline nucleus.

Figure 1A:
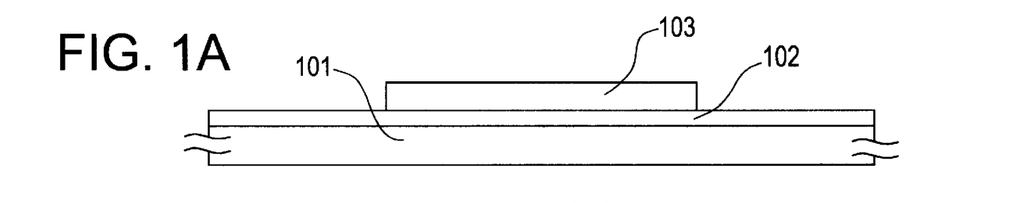
FIGS. 1A to 1D show a process of manufacturing a thin film transistor in accordance with one embodiment of the present invention.
Figure 1B:
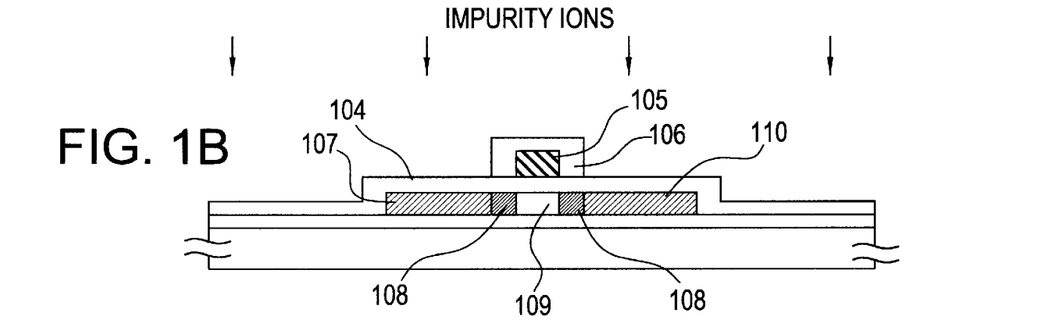
Figure 1C:
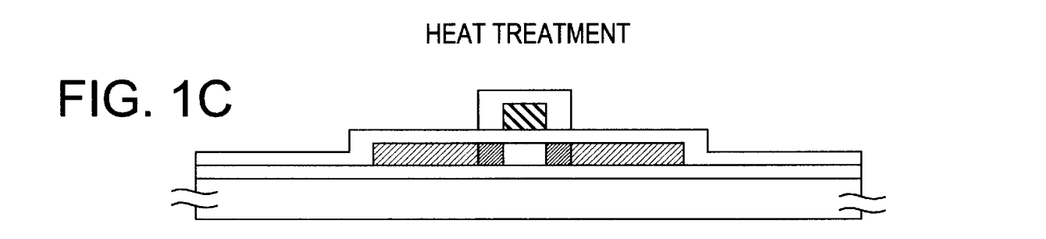
Figure 1D:
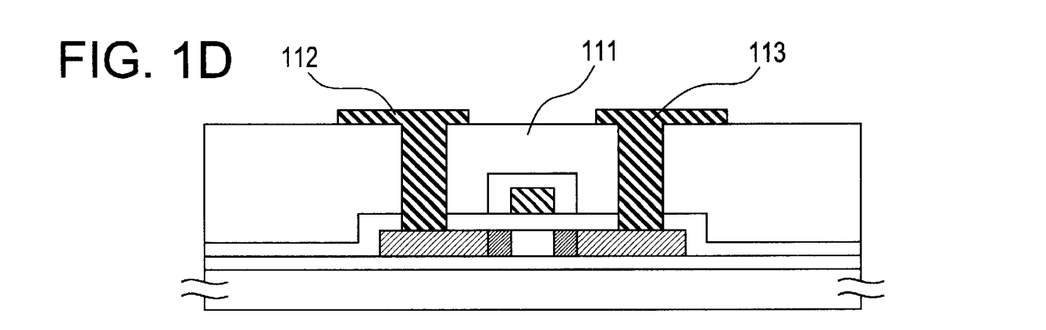

For example, in a thin film transistor shown in FIG. 1D, a crystal growth develops from an offset gate region 108 which is a periphery region of the channel formation region, as a result of which a source region 107 and a drain region 110 are crystallized in a process of FIG. 1C.

As said peripheral region of the channel formation region, an offset gate region, a light doped region and a non-doped region each having a crystal property without being subjected to ion injection are applicable.

As a metal element which promotes crystallization useable to the present invention disclosed in this specification, Fe, Co, Ni, Ru, Rh, Pd, Os, Ir, Pt, Cu, Ag and Au, which are elements interstitial with respect to silicon, are usable. Atoms interstitial with respect to silicon are dispersed into a silicon film during a heat treatment. While the interstitial elements are dispersed thereinto, the crystallization of silicon progresses simultaneously. In other words, the interstitial metal makes the crystallization of an amorphous silicon film promoted with a catalytic action of the dispersed metal.

The introduced amount (added amount) of the interstitial elements becomes important since the interstitial elements are allowed to be rapidly dispersed in the silicon film. In other words, the small introduced amount of the interstitial elements makes the effect of promoting crystallization low so that an excellent crystal property cannot be obtained. On the other hand, the excess amount of the interstitial atoms makes the semiconductor characteristic of silicon spoiled.

Therefore, there exists an optimum amount of introducing the interstitial metal elements into the amorphous silicon film. For example, it has been found that, in the case of using Ni as a metal element which promotes the crystallization, if the density of Ni in a crystallized silicon film is $1 \times 10^{15}$ cm$^{-3}$ or more, the effect of promoting crystallization can be obtained, whereas, if the density of Ni in the crystallized silicon film is $1 \times 10^{19}$ cm$^{-3}$ or less, the semiconductor characteristic is not hindered. The "density" used here is defined by the minimum value obtained through SIMS (Secondary Ion Measurement System). Also, the above recited metal elements other than Ni can obtain their effects in the same density range as that of Ni likewise.

Apart from the above recited metal atoms, the use of Al or Sn can make the crystallization of an amorphous silicon film promoted likewise. However, Al or Sn causes an alloy to be formed in combination with silicon so as not be dispersed and interstitial into a silicon film. Then, the crystallization progresses in such a manner that a crystal growth develops from a portion where Al or Sn is alloyed with silicon with that portion being a crystalline nucleus. In this case, as a result that Al or Sn is not dispersed into the silicon film, the crystallization progresses from the portion of the crystalline nucleus. In this way, in the use of Al or Sn, a crystal growth is conducted only from a portion where Al or Sn is introduced (that is, an alloy layer consisting of those elements with silicon). This causes a problem such that its crystal property is generally lowered in comparison with a case of using the foregoing interstitial elements such as Ni. For example, there arises such a problem that this makes it difficult to obtain a crystalline silicon film which is uniformly crystallized.

As a result that a metal element promoting the crystallization is introduced and a semiconductor layer with a region having a crystal property as well as a region having an amorphous property is subjected to a heat treatment, the amorphous region can be recrystallized with the crystalline region being a crystalline nucleus. In this situation, since the crystallization progresses from the crystalline region toward the amorphous region, mismatching of lattices is not produced in the vicinity of the interfaces between the crystalline region and the amorphous region, thereby being capable of preventing the defects from concentrating.

For example, a silicon semiconductor layer is crystallized by a metal element which promotes crystallization and includes a specified region which has been made amorphous with the injection of impurity ions giving one conductivity type thereinto. Such a silicon semiconductor layer is subjected to a heat treatment so that crystal growth progresses from the region having the crystal property toward the region which has been made amorphous by the injection of impurity ions giving one conductivity type. Thus, the region which has been made amorphous can be crystallized.

In this situation, since the crystallization progresses from the region having the crystal property toward the region having the amorphous property, defects resulting from mismatching of lattices can be prevented from being produced in the vicinity of the interfaces between the respective regions. Thus, the semiconductor layer having the crystal property where the defects do not concentrate in a specified region can be obtained.

Also, in a process of manufacturing a thin film transistor including a manufacturing process shown in FIGS. 3A to 3D, the active layer 203 is constituted by a silicon film which has been crystallized by the heat treatment due to the action of the metal element which promotes crystallization. During the process of FIG. 3B, impurity ions giving one conductivity type are injected into such an active layer 203 with a mask of the gate electrode 205 so that the source region 207 and the drain region 209 are formed in a self-aligning manner. When the source and drain regions have been made amorphous, a heat treatment is conducted at 550° C. for about 2 hours in the process of FIG. 3C. As a result, the crystal growth is made, as indicated by the arrows 301, toward the source and drain regions with the channel formation region 208 having the crystal property functioning as a crystalline nucleus.

The crystal growth indicated by the arrows 301 is conducted at a relatively low temperature for a short period of time with the channel formation region 208 functioning as the crystalline nucleus with the following causes.

(1) A catalyst element which promotes the crystallization of silicon has been introduced into the active layer 203.

(2) The source region 207 and the drain region 209 have been doped with an element having one conductivity type which is of a catalyst element for promoting crystallization.

Since the foregoing crystal growth is conducted from the channel formation region toward the source and drain regions as indicated by the arrows 301, the defects resulting from the mismatching of lattices do not concentrate in the vicinity of the interface between the channel formation region 208 and the source region 207, as well as in the vicinity of the interface between the channel formation region 208 and the source region 209.

The above and other objects and features of the present invention will be more apparent from the following description taken in conjunction with the accompanying drawings.

DETAILED DESCRIPTION OF THE PREFERRED EMBODIMENTS

Now, a description will be given to embodiments of the present invention with reference to the accompanying drawings.

(First Embodiment)

FIGS. 1A to 1D show a process of manufacturing a thin film transistor in accordance with a first embodiment of the present invention. The thin film transistor described in this embodiment can be used for an active matrix type liquid-crystal display unit, an image sensor or other thin-film integrating circuits.

First, a silicon oxide film having a thickness of 2000 Å is formed on a glass substrate (Corning 7059 glass) 101 as a first coating film 102 through the sputtering technique. The first coating film 102 is formed in order that an impurity is not dispersed from the glass substrate into an active layer. Then, an amorphous silicon film having a thickness of 1000 Å is formed on the first coating film 102 through the plasma CVD technique. It goes without saying that low pressure thermal CVD technique may be used instead of the plasma CVD technique.

After the formation of the amorphous silicon film, nickel is introduced into the amorphous silicon film as a catalyst metal which promotes crystallization. In this example, nickel elements are introduced into the amorphous silicon film using nickel acetate salt solution. In detail, nickel acetate salt is dropped on the surface of the amorphous silicon film and then treated through the spin coating technique using a spinner so that nickel is arranged in contact with the surface of the amorphous silicon film. Thereafter, the amorphous silicon film is subjected to a heat treatment at 550° C. for 4 hours so as to be crystallized. The heat treatment can be conducted at a temperature of 450° C. or more. However, the heating period of time is too long in the case of 500° C. or less whereas the problem on the heat-resistivity of the glass substrate is actually revealed in the case of 550° C. or more. As a result, it is proper to conduct the heat treatment at a temperature ranging from 500 to 550° C.

The crystalline silicon film obtained by crystallizing the amorphous silicon film is subjected to a patterning process, thereby obtaining an active layer 103 of a thin film transistor (FIG. 1A).

After the formation of the active layer 103, a silicon oxide film 104 having a thickness of 1000 Å, which functions as a gate insulating film, is formed thereon through the plasma CVD technique. Then, a thin film having a thickness of 5000 Å which mainly consists of aluminum is formed thereon through a vapor deposition technique and subjected to a patterning process, thereby forming a gate electrode 105. Subsequently, anodic oxidation is conducted in an electrolyte with the gate electrode functioning as an anode, thereby forming an oxide layer 106.

Thereafter, impurity ions are injected into the source region 107 and the drain region 110. In this example, P (phosphorus) ions are injected thereinto in order to form an n-channel thin film transistor. In this process, the source region 107 and the drain region 110 as well as the channel formation region 109 and the offset gate region 108 are simultaneously formed in a self-aligning manner (FIG. 2B).

In the foregoing process of injecting the impurity ions, the source region 107 and the drain region 110 are made amorphous. Thereafter, in the process of FIG. 2C, a heat treatment is conducted at 500° C. for four hours so that the source region 107 and the drain region 110 are recrystallized and P (phosphorus) which has been injected is activated. In this situation, the source region 107 and the drain region 110 are crystallized with the crystalline nucleus being formed by the channel formation region 109 and the offset gate region 108 (in particular, offset gate region 108) both having the crystal property. In other words, crystallization progresses from the interfaces between the offset gate region 108 and the source and drain regions toward the source and drain regions.

It is proper to conduct the foregoing heat treatment at a temperature ranging from 350 to 550° C. If the temperature is 350° C. or less, the heating effect is low whereas if it is 550° C. or more, the heat damage to the glass substrate is actually revealed. In the use of a material mainly containing aluminum as a gate electrode, it is preferable to set the upper limit of that temperature to 500° C. This is because a temperature of 500° C. or more causes such a problem that aluminum is dispersed from the gate electrode mainly containing aluminum into the gate insulating film.

In the foregoing process, nickel elements existing in the channel region 109 and the offset gate region 108 are dispersed into the source region 107 and the drain region 110, thereby promoting the crystallization. Also, since the source and drain regions have been doped with impurities giving one conductivity type (in this example, P (phosphorus), the crystallization is more facilitated (the crystallization progresses at 500° C. or less with being doped with P or B).

Hence, the recrystallization of the source and drain regions readily progresses during the heat treatment at 500° C. for four hours.

After the completion of the heat treatment, a silicon oxide film 111 having a thickness of 5000 Å is formed as an interlayer insulating film, and a piercing process is then conducted, whereby a source electrode 112 and a drain electrode 113 are formed of aluminum. Then, the hydrogenation process is conducted at 350° C. for one hour in hydrogen atmosphere, thereby completing a thin film transistor.

In the case where the structure described in this embodiment is applied, since the crystal growth progresses from the offset gate region 108 toward the source region 107 as well as the drain region 110 during the process of FIG. 2C, there arises no problem such that defects resulting from the lattice mismatching concentrate in the vicinity of the interface between the offset gate region 108 and the source region 110, and in the vicinity of the interface between the offset gate region 108 and the drain region 110. This can provide such effects that the dispersion of the thin film transistor characteristics is lowered, the deterioration or instability of the characteristics is restrained, and the off-state current is lowered.

(Second Embodiment)

A second embodiment is an example in which a silicon semiconductor is used for a gate electrode. FIGS. 3A to 3D show a process of manufacturing a thin film transistor in accordance with the second embodiment of the present invention.

First, a silicon oxide film 202 having a thickness of 2000 Å is formed on a glass substrate (Corning 7059 glass) 201 as a first coating film through the sputtering technique. Then, an amorphous silicon film having a thickness of 1000 Å is formed on the first coating film 202 through the plasma CVD technique or the low pressure thermal CVD technique. Subsequently, a metal element which promotes crystallization is introduced into an amorphous silicon film using a solution in which a silicon compound and an additive are solved in an organic solution. In this example, a solution for forming silicon oxide such as OCD (Ohka Diffusion Source) made by Tokyo Ohka Kogyo Corporation is used for maintaining the nickel compound therein. The OCD solution is generally used in the formation of a silicon oxide film or the like for passivation. The silicon oxide film can be formed by coating the OCD solution on a surface where a film is to be formed using a spinner and then conducting a predetermined baking process.

In this example, there is prepared solution which is obtained by mixing the OCD solution with solution where nickel (II) acetylacetonate is solved in methyl acetate and by adjusting the mixture so that silicon oxide is 2.0 wt % and nickel is 200 to 2000 ppm. Then, such solution is coated on the amorphous silicon film through the spin coating technique, and subjected to a prebaking process at 250° C. for 3 minutes, thereby forming a silicon oxide film containing nickel therein with a thickness of about 1300 Å.

Thereafter, the silicon oxide film is subjected to a heat treatment in the nitrogen atmosphere at 550° C. for 4 hours, thereby obtaining a silicon film having the crystal property. During this process, nickel is dispersed from the silicon oxide film which is in contact with the surface of the silicon film into the silicon film. After the heat treatment, the silicon oxide film is removed.

Subsequently, a patterning process is conducted to form an active layer 203 of the thin film transistor as shown in FIG. 3A. A silicon oxide film having a thickness of 1000 Å is formed as the gate insulating film 204 through the plasma CVD technique. Moreover, a silicon film having an n-type microcrystal structure with a thickness of 5000 Å is formed through the vapor heat CVD technique and then subjected to a patterning process, thereby forming a gate electrode 205. After the formation of the gate electrode 205, the source region 207 and the drain region 209 are doped with phosphorus by injecting impurity ions (phosphorus ions) thereinto. During this process, the source region 207 and the drain region 209 are made amorphous by the bombardment of ions. Also, a channel formation region 208 is formed without any injection of impurity ions (FIG. 3B).

After the completion of the process of injecting the impurity ions in the source and drain regions shown in FIG. 3B, a heat treatment is conducted so that the source and drain regions are recrystallized and the injected impurity ions are activated. The heat treatment is conducted at 550° C. for 2 hours. In this embodiment, since silicon is used as material of the gate electrode, the heat treatment can be conducted with the upper limit of the heat-resistant temperature of the glass substrate. It goes without saying that as the temperature of the heat treatment is higher, the effect is better (FIG. 3C).

During the heat treatment, the crystallization progresses toward the source and drain regions 207 and 209 as indicated by arrows 302 with the channel formation region 208 having the crystal property serving as a nucleus. In this manner, the recrystallization of the source and drain regions and the activation of the impurity ions which have been injected in the process of FIG. 3B are simultaneously conducted.

Subsequently, a silicon oxide film 211 is formed as an interlayer insulating film through the plasma CVD technique and subjected to a piercing process so that the source electrode 212 and the drain electrode 213 are formed of aluminum. Finally, the hydrogenation process is conducted at 350° C. for one hour in the hydrogen atmosphere, thereby completing a thin film transistor as shown in FIG. 3D.

(Third Embodiment)

A third embodiment is an example in which a laser beam is irradiated together with the heat treatment during the process shown in FIG. 3C. It has been found through measurement using a TEM photograph (Transmittance Electron Microscope photograph) or an ESR (Electron Spin Resonance) that the crystalline silicon film which has been crystallized at a temperature of about 500 to 550° C. using a metal element (for example, nickel element) that promotes crystallization has the following properties.

(1) The crystal growth progresses in the form of pillars or branches, and an amorphous component remains between the pillars or branches.

(2) The amorphous component remaining between the pillars or branches can be crystallized by the irradiation of a laser beam after the crystallization due to heating, being capable of improving the crystallizing ratio.

(3) The application of the laser beam in the above item (2) makes the density of defects in the film not decreased but inversely tend to be increased.

(4) The density of defects in the film can be decreased by further conducting a heat treatment after the irradiation of the laser beam in the above item (2).

In view of the above, this embodiment is characterized in that the irradiation of a laser beam starts from the gate electrode 205 side after the completion of the heat treating process during the process shown in FIG. 3C with the result that the crystal property of the source region 207 and the drain region 209 is improved, and also a heat treatment is conducted after the completion of the irradiation of the laser beam with the result that the density of defects in the active layer is decreased.

In other words, in this embodiment, in a process of annealing the source and drain regions after the injection of impurity ions, the following processes are executed.

During the annealing process due to a heat treatment, the source and drain regions are crystallized with the channel formation region serving as a crystalline nucleus simultaneously while the impurities are activated.

A laser beam is irradiated to the source and drain regions after the foregoing heat treatment, thereby improving the crystal property of the source and drain regions.

A heat treatment is further conducted after the foregoing irradiation of a laser beam, thereby decreasing the density of defects in the active layer.

A detailed process will be described below. First, processes until a process of injecting impurities into the source and drain regions are conducted in accordance with the manufacturing processes shown in FIGS. 3A to 3B. Then, the recrystallization of the source and drain regions and the activation of the impurity ions injected are conducted by heating at 550° C. for 2 hours. Thereafter, a KrF excimer laser beam (wavelength of 248 nm) is irradiated from the side of the gate electrode 205 to improve the crystal property of the source region 207 and the drain region 209. This process may be conducted with the irradiation energy density of the laser beam being 100 to 300 mJ/cm$^2$. Other types of laser beams may be used as a laser beam. Also, an intense light such as infrared rays may be irradiated instead of a laser beam. Moreover, it is effective to heat a sample to about 300 to 400° C. during the irradiation of a laser beam.

After the completion of the irradiation of a laser beam, a heat treatment is again conducted. In this example, a heat treatment is conducted at 550° C. for one hour. The heat treatment thus conducted makes the density of defects in the active layer decreased about one figure.

Sequentially, in the process shown in FIG. 3D, the interlayer insulating film 211, the source electrode 212 and the drain electrode 213 are formed and further subjected to a heat treatment at 350° C. in the hydrogen atmosphere to conduct hydrogenation, thus completing a thin film transistor.

In the foregoing description of this embodiment, the heat treatment, the irradiation of a laser beam and the heat treatment are conducted in the stated order. However, the heat treatment and the irradiation of a laser beam may additionally be repeated. In other words, the process may be repeated in the order of the heat treatment, the irradiation of a laser beam, the heat treatment, the irradiation of a laser beam and the heat treatment.

(Fourth Embodiment)

A fourth embodiment is characterized in that the irradiation of a laser beam is conducted through a glass substrate. It has been found that at least 90% of a light having a wavelength of 360 nm or more transmits through a Corning 7059 glass substrate. As a result, in the case of using a Corning 7059 glass substrate as a glass substrate and irradiating a laser beam from the glass substrate side, it is desirable to use an HgCl excimer laser beam (wavelength of 558 nm), an XeF excimer laser beam (wavelength of 483 nm), a KrO excimer laser beam (wavelength of 558 nm) or the like.

In the case of irradiating a laser beam from the substrate side, an energy (light energy) is also applied to the vicinity of the interfaces between the source and drain regions and the channel formation region. This prevents the generation of defects caused by the lattice mismatching in the vicinity of the interfaces between the source and drain regions and the channel formation region.

An example of a process in the case where the structure of this embodiment is applied will be described below.

(1) The processes shown in FIGS. 3A and 3B are conducted in the same manner as those of the third embodiment.

(2) A heat treatment is conducted at 550° C. for two hours, thereby conducting the recrystallization of the source and drain regions as well as the activation of the impurities injected.

(3) A XeF excimer laser beam having an irradiation energy density of 200 mJ/cm$^2$ is irradiated from the gate electrode side, thereby improving the crystal property of the active layer.

(4) A heat treatment at 550° C. for one hour is conducted, thereby decreasing the density of defects in the active layer.

After the completion of annealing the foregoing source and drain regions, as shown in FIG. 3D, the interlayer insulating film 211 is formed, subsequently the source and drain electrodes 212 and 213 are formed, and finally hydrogenation is conducted, thereby completing a thin film transistor.

(Fifth Embodiment)

A fifth embodiment is an example in which a thin film transistor is formed by using a metal element which promotes crystallization and a crystalline silicon film which has been grown in a direction parallel with a substrate (called a lateral growth).

FIGS. 4A to 4D show a process of manufacturing a thin film transistor in accordance with this embodiment of the present invention. First, a silicon oxide film having a thickness of 2000 Å is formed on a glass substrate 401 as a first coating film 402 through the sputtering technique. Then, an amorphous silicon film 403 having a thickness of 1000 Å is formed on the first coating film 402 through the plasma CVD technique or that low pressure thermal CVD technique.

Figure 4A:
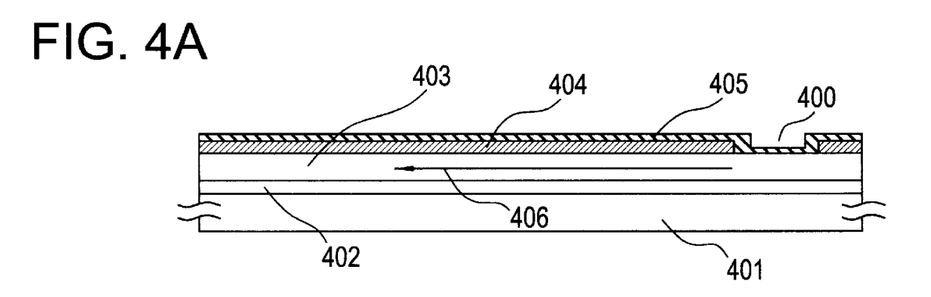
FIGS. 4A to 4D show a process of manufacturing a thin film transistor in accordance with still another embodiment of the present invention.

Subsequently, a mask 404 is formed of a resist. The mask 404 is constituted so as to expose a region indicated by reference numeral 400. A portion 400 has a slip shape longer than the width of the active layer. The opening 400 of the mask 404 is arranged so as to be directed longitudinally toward an opposite side of a drawing paper.

Then, a silicon oxide film 405 containing a nickel element is formed by coating the foregoing OCD solution to which nickel has been added through the spin coating technique and then prebaking it. The silicon oxide film 405 containing nickel is in contact with the amorphous silicon film at the portion 400. In other words, nickel becomes introduced from the region 400 into the amorphous silicon film.

In this situation, a heat treatment is conducted at 550° C. for four hours so that the amorphous silicon film 403 is crystallized. During this process, the crystallization progresses from the region 400 into which nickel has been introduced in a direction indicated by an arrow 406. It has been proved from the observation of a section TEM (Transmittance Electron Microscope) photograph that the crystallization progresses in the form of a pillar, a needle or a branch. In other words, it has been proved that the probability of existence of grain boundaries is low in the direction of growth of a crystal indicated by an arrow 406.

It is effective to irradiate a laser beam after the foregoing heat treatment to improve the crystal property. Moreover, it is effective to again conduct a heat treatment after the irradiation of a laser beam to decrease the density of defects in the film.

Figure 4B:
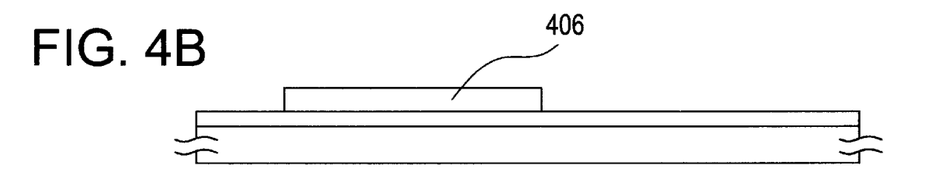

After the heat treatment makes the amorphous silicon film 403 formed into a crystalline silicon film, the silicon oxide film 405 and the resist mask 404 are removed therefrom. Then, a patterning process is conducted to thereby obtain an active layer 406 (FIG. 4B).

After the active layer 406 is obtained, a silicon oxide film constituting the gate insulating film 407 with a thickness of 1000 Å is formed through the plasma CVD technique. Further, a gate electrode 408 mainly containing aluminum is formed. Then, anodic oxidation is conducted in an electrolyte with the gate electrode 408 functioning as an anode, thereby forming an oxide layer 409 having a thickness of 2000 Å. In this example, a material mainly containing aluminum was used, however, a material enabling anodic oxidation such as tantalum may be used.

Figure 4C:
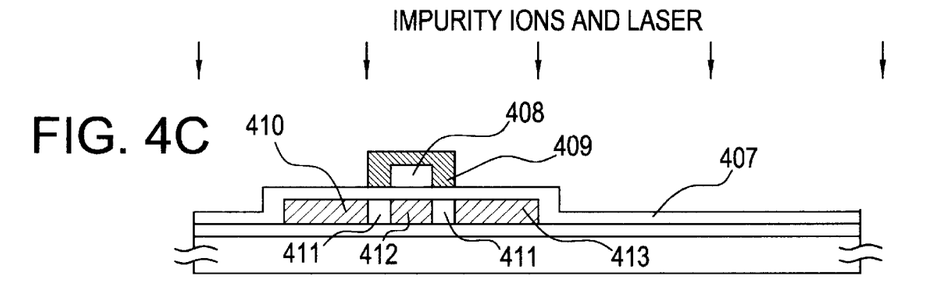

Sequentially, ions of phosphorus are injected when the material is of an n-channel type whereas ions of boron are injected when the material is of a p-channel type. During this process, with the gate electrode 408 and the oxide layer 409 in the periphery of the gate electrode 408 both serving as a mask, impurity ions giving one conductivity type are injected into the source region 410 and the drain region 413. Simultaneously, the offset gate region 411 and the channel formation region 412 are formed in a self-aligning manner. In the injection of ions, the source and drain regions are made amorphous (FIG. 4C).

Thereafter, a heat treatment is conducted at 45° C. for four hours so that the recrystallization of the source and drain regions and the activation of the impurity ions injected are conducted. Furthermore, a KrF excimer laser beam is irradiated from the gate electrode side, thereby enhancing the crystal property of the source and drain regions (FIG. 4C).

Figure 4D:
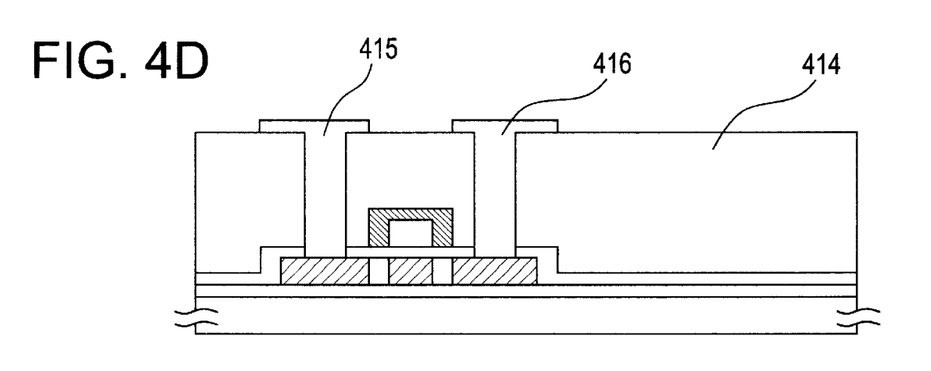

Subsequently, a silicon oxide film having a thickness of 7000 Å is formed as the interlayer insulating film 414 through the plasma CVD technique, the source electrode 415 and the drain electrode 416 are formed, and a hydrogenation process is conducted in the hydrogen atmosphere at 350° C. for one hour, thereby completing a thin film transistor (FIG. 4D).

In the case where the structure of this embodiment is applied, the direction in which the crystal growth progresses is made coincide with a direction in which carriers move in the active layer (coincide with a direction coupling the source region with the drain region), thereby being capable of obtaining a thin film transistor having a large mobility and allowing a large on-state current to flow. Also, a structure can be realized in which defects resulting from the lattice mismatching do not concentrate on or in the vicinity of the interface between the offset gate region 411 and the source region 410, and on or in the vicinity of the interface between the offset gate region 411 and the drain region 413. As a result, a thin film transistor without any instability and deterioration of the characteristics can be obtained.

(Sixth Embodiment)

A sixth embodiment is an example of a thin film transistor where a light doped region is formed in addition to the offset gate region. FIGS. 5A to 5D show a process of manufacturing a thin film transistor in accordance with the sixth embodiment of the present invention. First, a silicon oxide film 502 having a thickness of 2000 Å is formed on a glass substrate (Corning 7059 glass) 501 as a first coating film through the sputtering technique. Then, an amorphous silicon film having a thickness of 1000 Å is formed on the first coating film 502 through the plasma CVD technique or the low pressure thermal CVD technique. Thereafter, nickel is introduced into the amorphous silicon film by a technique in which the OCD solution described in the second embodiment is used.

Figure 5A:
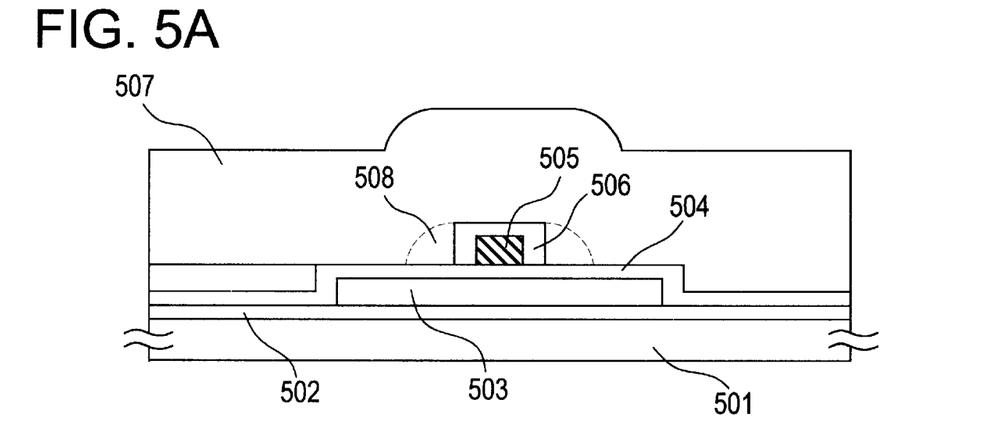
FIGS. 5A to 5D show a process of manufacturing a thin film transistor in accordance with yet still another embodiment of the present invention.

Sequentially, a heat treatment is conducted at 550° C. for four hours so that the amorphous silicon film is crystallized to obtain a crystalline silicon film. Further, an active layer 503 is obtained by subjecting the film to a patterning process. Then, a silicon oxide film having a thickness of 1000 Å is formed as a gate insulating film 504 through the plasma CVD technique. A gate electrode 505 mainly containing aluminum is formed, and anodic oxidation is conducted, thereby forming an aluminum oxide layer 506. In this example, the thickness of the oxide layer is 2000 Å.

Subsequently, an amorphous silicon film 507 having a thickness of 1 µm to 2 µm, for example, a thickness of 1.5 µm is formed through the plasma CVD technique or the sputtering technique. In this process, a vertical anisotropy etching is conducted through the RIE technique (Reactive Ion Etching). At this state, the silicon oxide remains in the region indicated by reference numeral 508. The size of the region where the amorphous silicon remains can be determined in accordance with the film thickness of the amorphous silicon film 507 and the etching conditions. (FIG. 5A)

Figure 5B:
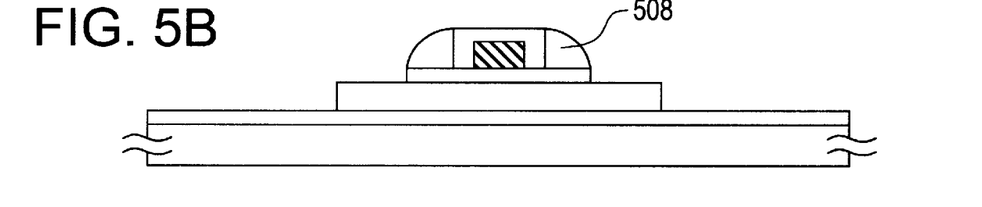

The foregoing vertical anisotropy etching is conducted whereby the amorphous silicon can remain at sides of the gate electrode (strictly speaking, in contact with the oxide layer in the periphery of the gate electrode) as shown in FIG. 5B. Then, the gate insulating film 504 is removed with the gate electrode 505, the oxide layer 506 in the periphery thereof, and a remainder 508 of the amorphous silicon serving as a mask.

Figure 5C:
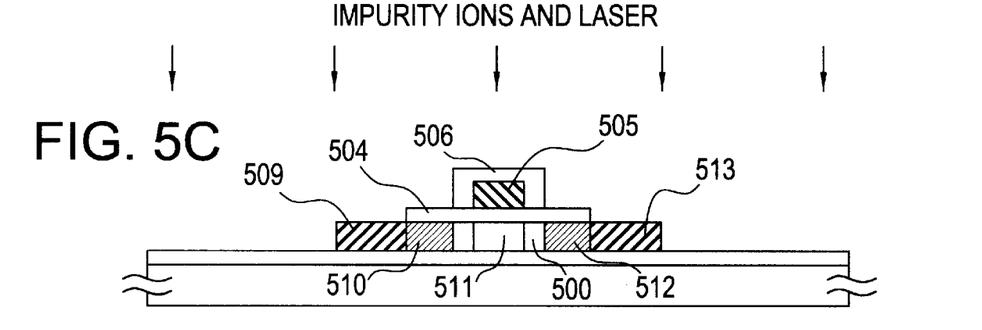

Subsequently, the remainder 508 of the amorphous silicon is removed, and impurities giving one conductivity type is injected. During this process, the impurity ions are not injected into a region 511 as a result of the gate electrode 505 forming a mask. Also, the impurity ions are not injected into a region 500 as a result of the oxide layer 506 forming a mask. Moreover, the impurity ions of a density lower than that of the regions 509 and 513 into which ions are directly injected are injected into the regions 510 and 512 as a result of the remaining gate insulating film 504 forming a mask.

In this manner, the channel formation region 511, the offset gate region 500, the light doped regions 510 and 512, the source region 509 and the drain region 513 are formed in a self-aligning manner. The light doped region 512 corresponds to what is generally called an LDD (light doped drain) region.

The injection of ions may be conducted with an acceleration voltage of 10 to 30 keV and a dose of amount of $5 \times 10^{14}$ to $5 \times 10^{15}$ cm$^{-2}$ using a phosphorus ion as an impurity ion. Thus, the density of phosphorus in the regions 509 and 513 forming the source and drain regions may be set to $1 \times 10^{20}$ to $2 \times 10^{21}$ cm$^{-3}$, and the density of phosphorus in the regions 510 and 512 forming the light doped regions may be set to $1 \times 10^{17}$ to $2 \times 10^{18}$ cm$^{-3}$. The density of phosphorus is a measured value obtained by SIMS (Secondary Ion Measuring System). A difference in the density of impurities results from the prevention of a part of ions by the remaining gate insulating film 504.

In the foregoing process, the source and drain regions 509 and 513 as well as the light doped regions 510 and 512 are made amorphous. In this situation, a heat treatment is conducted at 450° C. for four hours to thereby conduct the recrystallization of the region into which impurity ions have been injected in the preceding process and the activation of the impurities. In the heat treating process, the crystallization progresses from the offset gate region 500 keeping the crystal property toward the light doped regions 510 and 512 and further toward the source and drain regions 509 and 513.

In this manner, the crystal growth progresses contiguously from the offset gate region 500 toward the source and drain regions, thereby being capable of obtaining a crystal structure contiguous from the channel formation region 511 to the source region 509 and further from the channel formation region 511 to the drain region 513 As a result, a structure where the defects resulting from the lattice mismatching do not concentrate in the middle thereof can be realized.

It is effective that a laser beam or intense light is irradiated from a front surface or rear surface of the substrate after the foregoing treating process to further improve the crystal property of the active layer. It is also effective to further conduct a heat treatment after the irradiation of a laser beam or intense light.

Figure 5D:
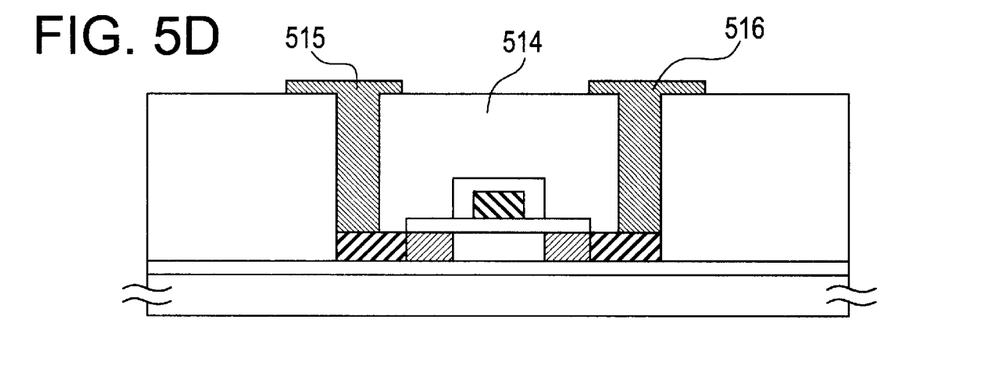

Thereafter, the interlayer insulating film 514 which is made of silicon oxide is formed and the source electrode 515 and the drain electrode 516 are also formed. Then, a heat treatment is conducted in the hydrogen atmosphere at 350° C. for one hour, to thereby make a hydrogenation. Thus, a thin film transistor is completed (FIG. 5D).

The source and drain regions which have been made amorphous by the injection of the impurity ions are subjected to crystal growth with the crystallized channel formation region forming a crystalline nucleus, as a result of which defects can be prevented from concentrating between the source and drain regions and the channel formation region. This causes the problems such as the instability of the operation of the thin film transistor, the dispersion of the characteristics and the large off-state current, which result from the defects, to be restrained.

The invention described in this specification has the following advantages:

(1) The recrystallization and activation of the source and drain regions can be conducted at a low temperature in comparison with the prior art.

(2) The structure in which defects in the interfaces between the source and drain regions and the channel formation region are reduced can be provided.

(3) A thin film transistor sufficiently high in the crystal property of the source and drain regions can be provided.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. It is intended that the scope of the invention be defined by the claims appended hereto, and their equivalents.

What is claimed is:

1. A method of manufacturing a semiconductor device, said method comprising the steps of:

introducing a material for promoting crystallization of silicon into an amorphous semiconductor film comprising silicon;

heating said amorphous semiconductor film to form a crystalline semiconductor film;

forming at least a semiconductor island by patterning said crystalline semiconductor film, said semiconductor island including a channel region of said semiconductor device;

selectively introducing phosphorus into a part of said semiconductor island in order to form a pair of light doped regions, a source region and a drain region of said semiconductor device where said source and drain regions are rendered amorphous while said channel region remains crystalline, one of the light doped regions being formed between the source region and the channel region while the other of the light doped regions being formed between the drain region and the channel region; and then heating said semiconductor island to diffuse said material from said channel region where said phosphorus has not been introduced toward said source and drain regions where said phosphorus has been introduced through the pair of light doped regions, wherein a first concentration of phosphorus in the source and drain regions is higher than a second concentration of the material in the channel region after the step of heating the semiconductor island to diffuse the material, wherein each of the source region and the drain region comprises phosphorus at a concentration in a range of $1 \times 10^{20}$ to $2 \times 10^{21}$ cm$^{-3}$, and each of the pair of light doped regions comprises phosphorus at a concentration in a range of $1 \times 10^{17}$ to $2 \times 10^{18}$ cm$^{-3}$.

2. The method of claim 1, wherein said material is at least one selected from the group consisting of Fe, Co, Ni, Ru, Rh, Pd, Os, Ir, Pt, Cu, Ag and Au.

3. The method of claim 1 wherein the density of said material in the semiconductor island is not higher than $1 \times 10^{19}$ cm$^{-3}$.

4. The method of claim 1, wherein said heat treatment to grow crystal from said channel region toward said source and drain regions is conducted at a temperature of 350 to 550° C.

5. The method of claim 1, wherein before or after said heat treatment to grow crystal from said channel region toward said source and drain regions a laser beam or intense light is irradiated to said semiconductor island.

6. A method of manufacturing a semiconductor device, comprising the steps of:

introducing a material for promoting crystallization of silicon into an amorphous semiconductor film comprising silicon;

heating said amorphous semiconductor film to form a crystalline semiconductor film;

forming at least a semiconductor island by patterning said crystalline semiconductor film, said semiconductor island including a channel region of said semiconductor device;

forming a gate insulating film on the semiconductor island;

forming a gate electrode over the semiconductor island having the gate insulating film therebetween;

selectively introducing phosphorus into regions of said semiconductor island with the gate insulating film and the gate electrode as a mask in order to form a source region and a drain region and a pair of light doped regions of said semiconductor device where said source and drain regions are rendered amorphous while said channel region remains crystalline, and where one of the light doped regions is formed between the source region and the channel region while the other of the light doped regions is formed between the drain region and the channel region; and then heating said semiconductor island to diffuse said material from said channel region where said phosphorus has not been introduced toward said source and drain regions where said phosphorus has been introduced through the pair of light doped regions, wherein a first concentration of phosphorus in the source and drain regions is higher than a second concentration of the material in the channel region after the step of heating the semiconductor island to diffuse the material, wherein each of the source region and the drain region comprises phosphorus at a concentration in a range of $1 \times 10^{20}$ to $2 \times 10^{21}$ cm$^{-3}$, and each of the pair of light doped regions comprises phosphorus at a concentration in a range of $1 \times 10^{17}$ to $2 \times 10^{18}$ cm$^{-3}$.

7. The method of claim 6, wherein said material is at least one selected from the group consisting of Fe, Co, Ni, Ru, Rh, Pd, Os, Ir, Pt, Cu, Ag and Au.

8. The method of claim 6 wherein the density of said material in the semiconductor island is not higher than $1 \times 10^{19}$ cm$^{-3}$.

9. The method of claim 6, wherein said heat treatment to grow crystal from said channel region toward said source and drain regions is conducted at a temperature of 350 to 550° C.

10. The method of claim 6, wherein before or after said heating treatment to grow crystal from said channel region toward said source and drain regions a laser beam or intense light is irradiated to said semiconductor island.

11. A method of manufacturing a thin film transistor comprising the steps of:

disposing a material for promoting crystallization of silicon in contact with an amorphous semiconductor film comprising silicon formed over a substrate;

crystallizing said amorphous semiconductor film;

patterning the crystallized semiconductor film into a semiconductor island;

forming a gate insulating film on said semiconductor island;

forming a gate electrode over a portion of said semiconductor island with said gate insulating film interposed therebetween;

oxidizing a surface of said gate electrode to form an insulating oxide layer thereon;

introducing phosphorus into portions of said semiconductor island with said gate insulating film and said gate electrode as a mask in order to form a source region and a drain region in said semiconductor island, to form a pair of light doped regions wherein one of the pair of light doped regions is formed between the source region and the channel region while the other of the pair of light doped regions is formed between the drain region and the channel region, and to define a channel region between the pair of light doped regions wherein said source and drain regions are rendered amorphous while said channel region remains crystalline; and heating said semiconductor island so that said material diffuses from said channel region toward said source and drain regions through the pair of light doped regions, wherein a first concentration of phosphorus in the source and drain regions is higher than a second concentration of the material in the channel region after the step of heating the semiconductor island to diffuse the material, wherein each of the source region and the drain region comprises phosphorus at a concentration in a range of $1 \times 10^{20}$ to $2 \times 10^{21}$ cm$^{-3}$, and each of the pair of light doped regions comprises phosphorus at a concentration in a range of $1 \times 10^{17}$ to $2 \times 10^{18}$ cm$^{-3}$.

12. The method of claim 11 wherein the step of said annealing is a heat treatment.

* * * * *

UNITED STATES PATENT AND TRADEMARK OFFICE
CERTIFICATE OF CORRECTION

PATENT NO. : 6,194,255 B1 Page 1 of 1
APPLICATION NO. : 08/839941
DATED : February 27, 2001
INVENTOR(S) : Hiroki et al.

It is certified that error appears in the above-identified patent and that said Letters Patent is hereby corrected as shown below:

On the title page item [73] Assignee's name "Semiconductor Energy Laboratry Co., Ltd" should be deleted, and replaced with --Semiconductor Energy Laboratory Co., Ltd.--.

Signed and Sealed this

Twelfth Day of May, 2009

JOHN DOLL
*Acting Director of the United States Patent and Trademark Office*